United States Patent
Srinivasan et al.

(10) Patent No.: US 11,900,998 B2
(45) Date of Patent: Feb. 13, 2024

(54) BIPOLAR DECODER FOR CROSSPOINT MEMORY

(71) Applicant: Intel Corporation, Santa Clara, CA (US)

(72) Inventors: Balaji Srinivasan, Folsom, CA (US); Sandeep Kumar Guliani, Folsom, CA (US); Mase J. Taub, Folsom, CA (US); Derchang Kau, Cupertino, CA (US); Ashir G. Shah, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 628 days.

(21) Appl. No.: 16/948,300

(22) Filed: Sep. 11, 2020

(65) Prior Publication Data

US 2022/0084589 A1    Mar. 17, 2022

(51) Int. Cl.
*G11C 8/08* (2006.01)
*G11C 13/00* (2006.01)

(52) U.S. Cl.
CPC ...... *G11C 13/0028* (2013.01); *G11C 13/0026* (2013.01)

(58) Field of Classification Search
CPC ............ G11C 13/0028; G11C 13/0026; G11C 2013/0052; G11C 2013/0092; G11C 8/08; G11C 8/10; G11C 13/004; G11C 13/0069; G11C 7/12; G11C 2213/71; G11C 2213/77; G11C 13/0033; G11C 13/0004; G11C 13/0023; G11C 13/0038
See application file for complete search history.

(56) References Cited

U.S. PATENT DOCUMENTS

| | | |
|---|---|---|
| 10,636,490 B1 | 4/2020 | Lin et al. |
| 10,636,498 B1 | 4/2020 | Lien et al. |
| 10,878,905 B1 | 12/2020 | McCollum et al. |
| 10,943,662 B1 | 3/2021 | Linnen et al. |
| 11,276,465 B1 | 3/2022 | Srinivasan et al. |
| 2018/0277206 A1* | 9/2018 | Park .................. G11C 13/0033 |
| 2019/0013071 A1 | 1/2019 | Srinivasan et al. |
| 2019/0035481 A1 | 1/2019 | Kim |
| 2019/0066789 A1 | 2/2019 | Sakai et al. |
| 2020/0006379 A1 | 1/2020 | Nishikawa et al. |

(Continued)

OTHER PUBLICATIONS

Notice of Allowance for U.S. Appl. No. 16/947,886 dated Nov. 5, 2021, 10 pages.

*Primary Examiner* — Hien N Nguyen
(74) *Attorney, Agent, or Firm* — Alliance IP, LLC

(57) ABSTRACT

A memory device including a memory array and address lines; and decoder circuitry to apply a first bias to a WL coupled to a memory cell selected for a memory operation, a second bias to a BL coupled to the selected memory cell, and one or more neutral biases to the other BLs and WLs of the memory array; wherein the decoder circuitry comprises a plurality of bias circuits coupled to the address lines, a first bias circuit of the plurality of bias circuits comprising a transistor pair and an additional transistor coupled to an address line of the plurality of address lines, wherein the bias circuit is to apply, to the address line, the first bias through the transistor pair in a first state, the second bias through the transistor pair in a second state, and the neutral bias through the additional transistor in a third state.

20 Claims, 9 Drawing Sheets

(56) References Cited

U.S. PATENT DOCUMENTS

| | | |
|---|---|---|
| 2020/0152273 A1 | 5/2020 | Lee |
| 2020/0185032 A1 | 6/2020 | Lin et al. |
| 2020/0273508 A1 | 8/2020 | Srinivasan et al. |
| 2020/0301667 A1 | 9/2020 | Hung et al. |
| 2020/0321058 A1 | 10/2020 | Lee et al. |
| 2020/0321066 A1 | 10/2020 | Oh |
| 2020/0402575 A1* | 12/2020 | Yoon .................. G11C 13/0033 |
| 2021/0012834 A1 | 1/2021 | Hsu |
| 2021/0019608 A1 | 1/2021 | Tran et al. |
| 2021/0082516 A1 | 3/2021 | Tran et al. |
| 2021/0118501 A1* | 4/2021 | Cui .......................... G11C 8/08 |
| 2021/0202018 A1 | 7/2021 | Hirst et al. |
| 2021/0217476 A1 | 7/2021 | Shirakawa et al. |
| 2022/0172777 A1* | 6/2022 | Terada ..................... G11C 7/12 |

\* cited by examiner

|  | POS | | NEG | | IDLE |
| --- | --- | --- | --- | --- | --- |
|  | SEL | DESEL | SEL | DESEL | SEL/DESEL |
| gp | VPPs | VPPs | VSS | VSS | VSS |
| lselp | VEE | VPPs | VSS | VEE | VEE |
| lbwl | VPPs | VSS | VNNs | VSS | VSS |
| lseln | VSS | VCC | VCC | VNNs | VCC |
| gn | VSS | VSS | VNNs | VNNs | VSS |

FIG. 11

|  | POS | | NEG | | IDLE |
| --- | --- | --- | --- | --- | --- |
|  | SEL | DESEL | SEL | DESEL | SEL/DESEL |
| gp | VPPs | VPPs | VSS | VSS | VSS/VPPs |
| lselp | VSS | VPPs | VSS | VPPs | VPPs |
| lbwl | VPPs | VSS | VNNs | VSS | VSS |
| lseln | VSS | VNNs | VSS | VNNs | VNNs |
| gn | VSS | VSS | VNNs | VNNs | VSS/VNNs |
| lselg | VSS | VCC | VNN | VCC | VCC |

FIG. 12

BIPOLAR DECODER FOR CROSSPOINT MEMORY

FIELD

The present disclosure relates in general to the field of computer development, and more specifically, to crosspoint memory devices.

BACKGROUND

A storage device may include non-volatile memory, such as multi-stack 3D crosspoint memory cells or arrays. Decoders (which typically are part of memory device switch circuitries) are generally used to select and deselect either wordlines or bitlines of a given memory array in a 3D crosspoint architecture. A decoder may include a plurality of switches (e.g., from hundreds to thousands of switches depending on the size of the memory array).

The process of selecting an address line, such as either a wordline (WL) or bitline (BL), typically entails a high amount of energy expenditure to switch transistors to effect the selection, where the power to the switch a transistor is a function of the capacitance between two given nodes times the square of a voltage differential between the two nodes (or $CV^2$). Such high energy expenditure in decoder addressing can occur for example where multiple transistors require their gate biases to be changed from an idle bias to result in the address line connected thereto to be deselected in a decoder addressing operation, and to therefore allow a given address line to be selected.

BRIEF DESCRIPTION OF THE DRAWINGS

FIG. 11 is a table illustrating bias voltages of the decoder illustrated in FIG. 5 in accordance with certain embodiments.

FIG. 12 is a table illustrating bias voltages of the enhanced decoder illustrated in FIG. 8 in accordance with certain embodiments.

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
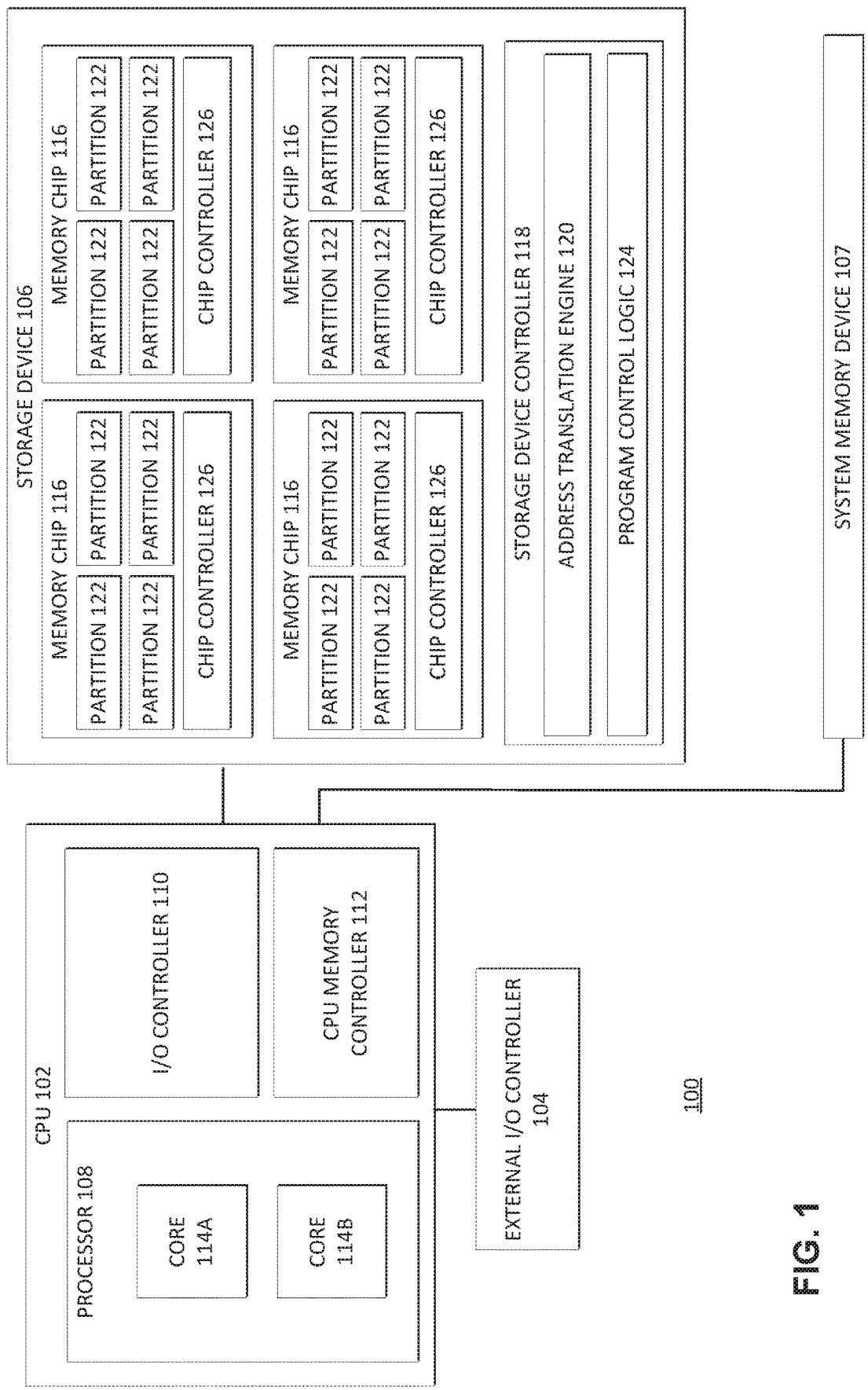
FIG. 1 is a schematic illustration of a block diagram of components of a computer system in accordance with certain embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than or equal to the threshold voltage of the memory cell, the memory cell may be sensed as storing a logic one and when the VDM is lower than the threshold voltage of the memory cell, the memory cell may be sensed as storing a logic zero.

In various embodiments of the present disclosure a bipolar decoder architecture that reduces the energy consumption of the decoder used to select and deselect address lines during memory operations is provided. In some embodiments, the decoder may include bias circuits that each include a first transistor that when selected is to apply a positive bias to an address line, a second transistor that when selected is to apply a negative bias to the address line, and a third transistor that when selected is to apply a neutral bias to the address line. Advantageously, embodiments of the decoder may avoid the switching of gate voltages in bias circuits supplying the neutral bias to the unselected address lines.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM and chip SRAM each are adapted to execute internal firmware or software of the storage device 106 and memory chip 116 respectively. For example, the logic to be implemented by program control logic 124, upon the issuance of a command, for example from the host or CPU 102 to execute the logic, may be moved from a memory storing the logic to SRAM (such as a NVM—not shown) such that the logic may be executed by the storage device controller 118 which will have access to the logic instructions by way of the associated SRAM. Similarly, the logic to be implemented by the chip controller 126, upon the issuance of a command, for example from the host or CPU 102 to execute the logic, may be moved from a memory storage the logic to the associated SRAM (such as a NVM—not shown) such that the logic may be executed by the associated chip controller 126 which will have access to the logic instructions by way of the associated SRAM.

Figure 2:
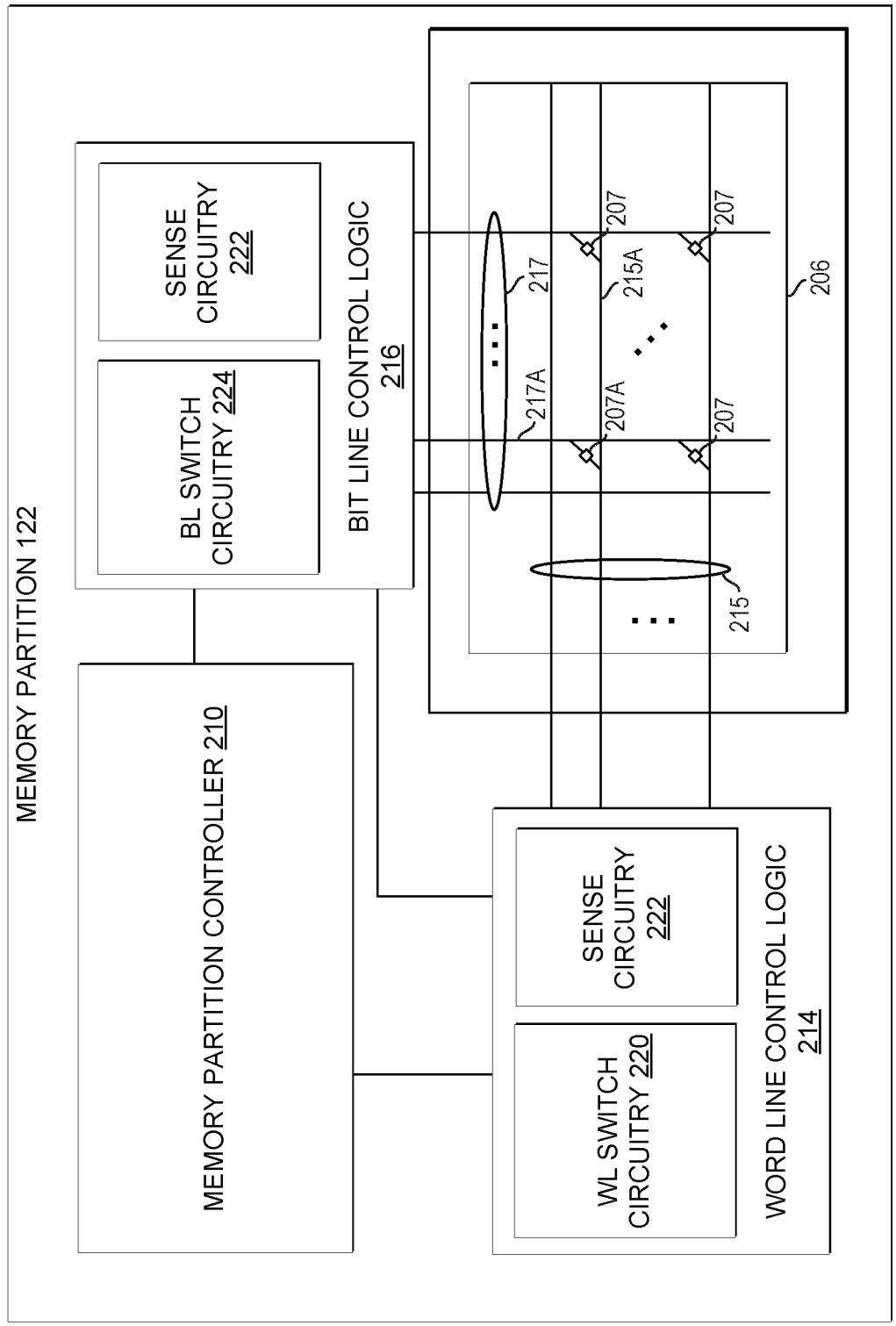
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In various embodiments, the material of a memory element may exhibit a low conductance state or a high conductance state indicative of the data stored by the memory element. In one example, a memory cell 207 may comprise a resistor having a high resistance state and a low resistance state.

In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, e.g., a select device coupled to the memory element. The select devices are configured to facilitate combining a plurality of memory elements into an array.

In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION and/or MICRON TECHNOLOGY, INC.

During a programming operation (e.g., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the selected WL and a second bias voltage to the selected BL that cross at the target memory cell for a time interval. A resulting differential bias voltage (a demarcation read voltage (VDM)) across the memory element is configured to be greater than a maximum set voltage and less than a minimum reset voltage for the memory element. Selection of the selected WL and selected BL and application of the first bias and second bias voltage may be implemented by a decoder in a switch circuitry, such as WL switch circuitry 220 and BL switch circuitry 224. In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still receive a portion of VDM (e.g., approximately ½ of VDM), with only cell 207A receiving the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (e.g., selector) coupled to the memory element. Select devices may include ovonic threshold switches, diodes, bipolar junction transistors, field-effect transistors, etc. Memory array 206 may be configured to store binary data and may be written to (e.g., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A. For example, WL switch circuitry 220 may include a plurality of switches that each correspond to a particular WL. In one embodiment, each switch includes a pair of metal oxide semiconductor field effect transistors (MOSFETs) comprising a positive-type (p-type) metal oxide semiconductor transistor (PMOS) and a negative-type (n-type) MOS transistor (NMOS). The pair may form a complementary MOS circuit (CMOS).

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
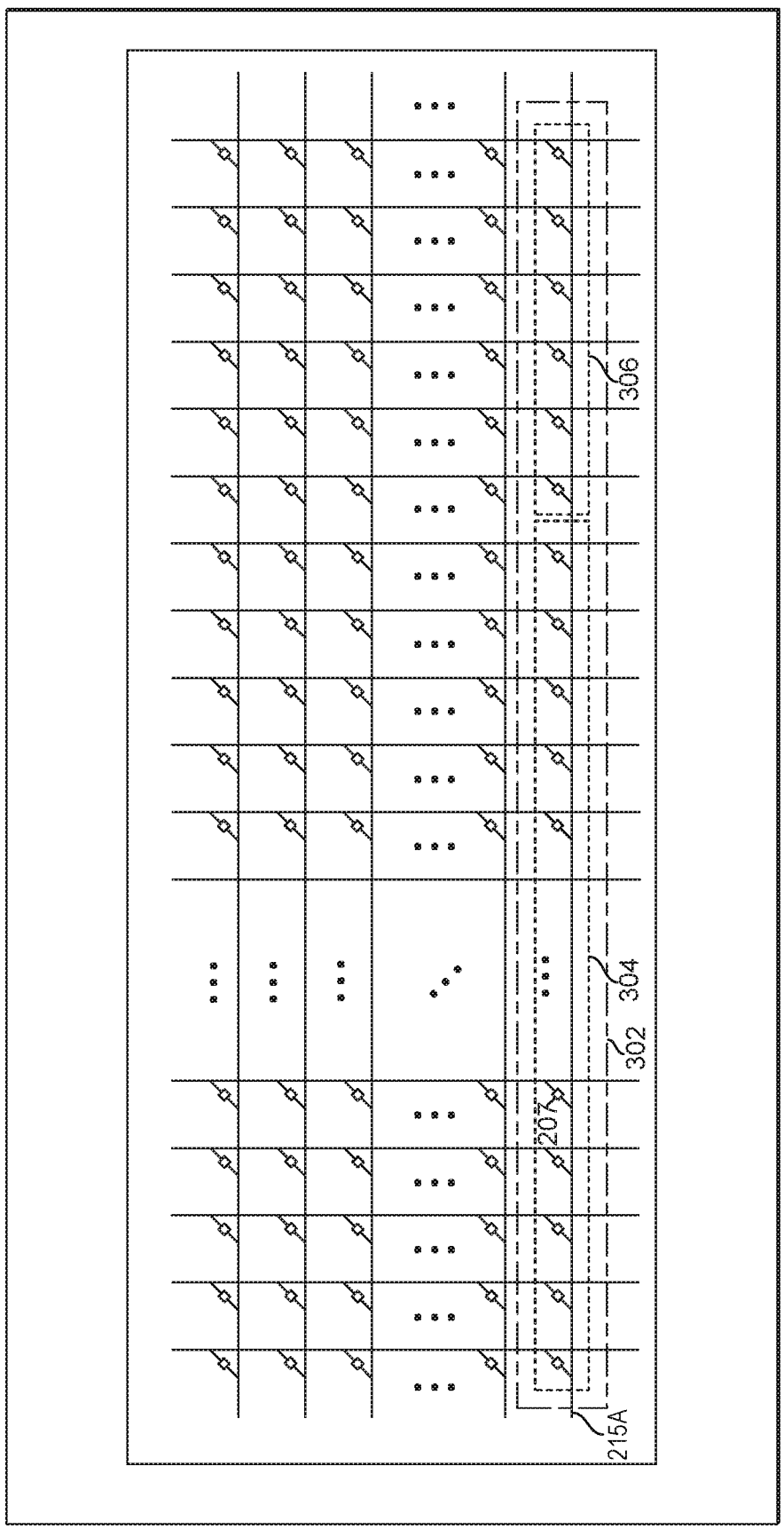
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers.

Figure 4:
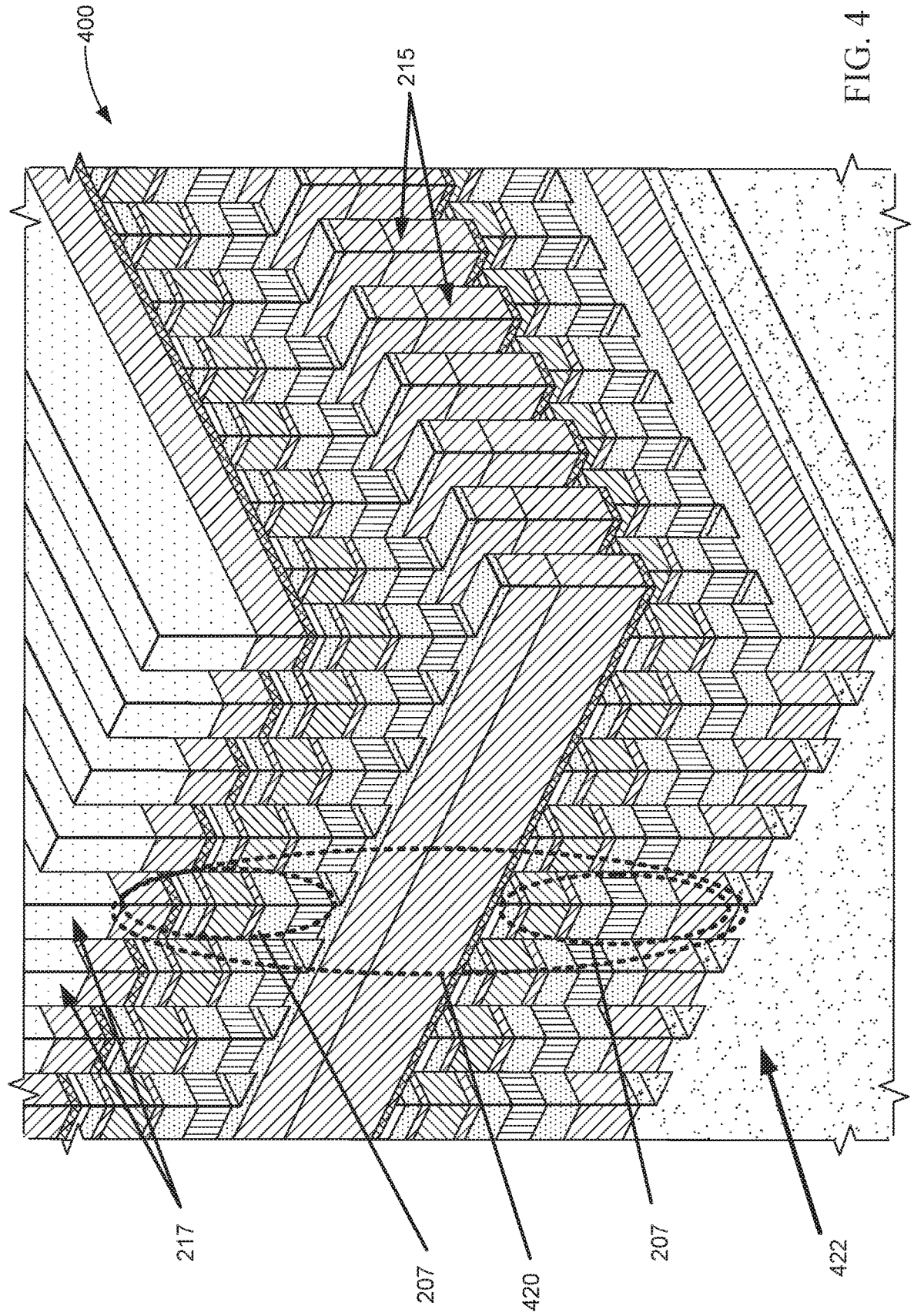
FIG. 4 is a perspective view of portions of a 3D crosspoint memory stack according to one embodiment.

FIG. 4 is a perspective diagram of an example of a portion of stack 400 of a 3D crosspoint memory device including memory arrays such as those of FIGS. 2 and 3. The specific layers are merely examples and will not be described in detail here. Stack 400 is built on substrate structure 422, such as silicon or other semiconductor. Stack 400 includes multiple pillars 420 as memory cell stacks of memory cells 207. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. More generically, WLs and BLs can be referred to as "address lines", referring to signal lines used to address memory cells. Different architectures can use different numbers of stacks of devices, and different configuration of WLs and BLs. It will be understood that the space between pillars 420 is typically an insulator. In one example, stack 400 the BL and WL are made of tungsten metal.

At least some of WLs 215 may correspond to WLs 215 of FIG. 2. At least some of the BLs 217 may correspond to BLs 217 of FIG. 2. Substrate structure 422, such as a silicon substrate, may include control circuitry therein (not shown), such as control circuitry including transistors, row decoders, page buffers, etc. Memory cells 207 may correspond to memory cells 207 of FIG. 2. The control circuitry of substrate structure 422 may include, for example, a memory partition controller such as memory partition controller 210, BL control logic such as BL control logic 216, and WL control logic such as WL control logic 214 of FIG. 2. Each row of WLs 215 extending in the Y direction, the corresponding cells as coupled to corresponding BLs, would define a memory array, and may correspond to a memory array such as memory array 206 of FIGS. 2 and 3.

Figure 5:
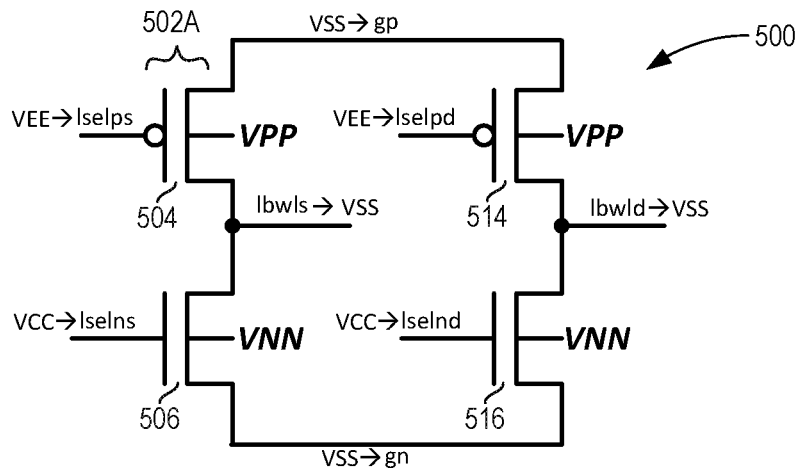
FIG. 5 is a schematic illustration of a portion of a decoder circuitry for address lines in a 3D crosspoint memory architecture in an idle state in accordance with certain embodiments.
Figure 6:
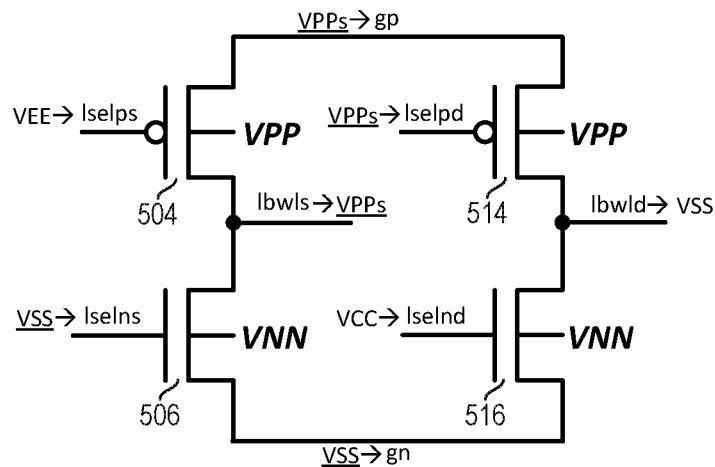
FIG. 6 is a schematic illustration of a portion of the decoder circuitry of FIG. 5 in a positive bias state in accordance with certain embodiments.
Figure 7:
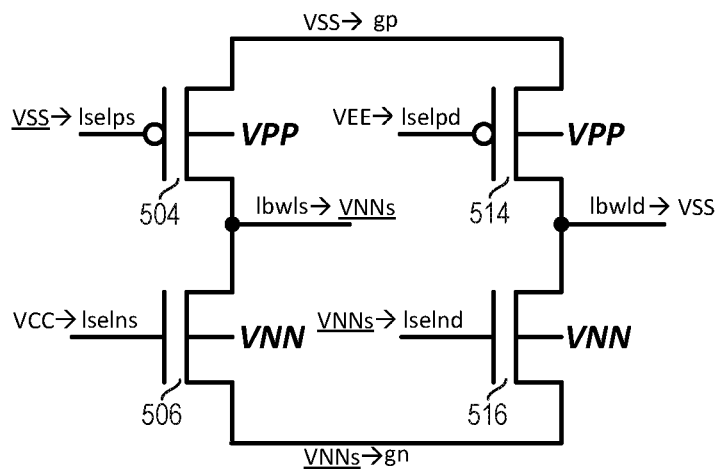
FIG. 7 is a schematic illustration of a portion of the decoder circuitry of FIG. 5 in a negative bias state in accordance with certain embodiments.

Reference is now made to FIGS. 5-7 which respectively show a decoder portion 500 where the decoder portions may be part of decoders of switch circuitries 220 or 224 of FIG. 2.

Reference is now made to FIG. 5, which shows a portion 500 of a decoder circuitry (or decoder architecture), including two pairs of identical switches 502 (502a and 502b), with switch 502A in the figures herein to couple a select bias voltage to a selected address line (either a WL or a BL) (accordingly, the nodes of the switch 502A each include a suffix "s" for select in their titles) and 502B to couple a deselect bias voltage to a deselected address line (again, either a WL or a BL) (accordingly, the nodes of the switch 502B each include a suffix "d" for deselect in their titles). In various embodiments (although not shown), additional switches 502 are used to couple the deselect bias voltage (or multiple different deselect bias voltages) to all other deselected address lines of a particular type (that is, of either the WL type or of the BL type), such that there is a switch for each address line (WL or BL) in a given memory array.

A bipolar decoder (a portion 500 of which is shown in FIG. 5 and in subsequent figures) may according to some embodiments be used for the set of WLs or the set of BLs. Thus, switch circuitries 220 (WL switch circuitry) and 224 (BL switch circuitry) may each include a dedicated decoder circuitry (e.g., one for WL switch circuitry 220 and one for BL switch circuitry 224) that operates on, respectively, all the WLs (for WL switch circuitry 220) and the BLs (for BL switch circuitry 224). Thus, in the instant description a reference to address lines ("lbwl") of a given decoder or a given decoder portion in the context of a description of a decoder circuitry herein may refer to either address lines that include only WLs or to address lines that include only BLs for that given decoder being described, and not both WLs and BLs for the same decoder being described.

In a particular embodiment, when a particular memory cell is targeted for a memory operation, a first switch (e.g., of WL switch circuitry 220) couples a positive select bias voltage to the wordline coupled to the targeted memory cell, a first plurality of switches (e.g., of WL switch circuitry 220) couple a neutral bias voltage to the other wordlines of the array, a second switch (e.g., of BL switch circuitry 224) couples a negative select bias voltage to the bitline coupled to the targeted memory cell, and a plurality of second switches (e.g., of BL switch circuitry 224) couple a the neutral bias voltage to the other bitlines of the array. When a different memory cell coupled to a different wordline and bitline is targeted, the selected bitline and wordline may be deselected and the appropriate wordline and bitline are selected by the appropriate switches.

Various voltages are referenced herein. VPP may refer to a high magnitude positive bias, VNN may refer to a high magnitude negative bias, VPPs may refer to a high magnitude positive selection bias with a magnitude up to VPP, VNNs may refer to a high magnitude negative selection bias with a magnitude up to VNN, VCC may refer to a low magnitude positive bias supply, VEE may refer to a low magnitude negative bias supply, and VSS may refer to 0V or reference ground (although not limited thereto, for example if VSS is a non-zero voltage the other voltages should scale appropriately). Thus, the voltages may have the following relationship:
VPP>=VPPs>VCC>VSS>VEE>VNNs>=VNN.

Various embodiments herein are compatible with both split voltage architectures (e.g., VPP is above 0V, VSS is 0V, and VNN is below 0V) as well as non-voltage splitting architectures (e.g., VNN is greater than or equal to zero, and VSS and VPP are both greater than VNN).

The terms "positive" and "negative" as used herein to modify the term "voltage", may refer to the relative magnitudes in combination with the signs of the voltages. Thus, these terms may, but do not necessarily, refer to the actual signs of the voltage (e.g., if one voltage has a positive sign and the other voltage has a negative sign then the first voltage is the positive voltage and the second voltage is the negative voltage). As used herein when referring to a positive voltage and a corresponding negative voltage, the positive voltage is a voltage that is higher in value than the corresponding negative voltage. For example, a first positive voltage may be +5 volts and a corresponding first negative voltage may be −5 volts. Alternatively, a second positive voltage may be +10 volts and a corresponding second negative voltage may be 0 volts. As yet another alternative, a third positive voltage may be +15 volts while a corresponding third negative voltage may be +5 volts. As yet another alternative, a fourth positive voltage may be 0 volts while a corresponding fourth negative voltage may be −10 volts.

Referring still to FIG. 5, each switch 502 includes a PMOS/NMOS pair (e.g., PMOS 504 is paired with NMOS 506 and PMOS 514 is paired with NMOS 516) and may be coupled to its respective address line (hereinafter "lbwl"), which may include a WL or a BL, such as one of WLs 215 or BLs 217 of FIG. 2, at a common drain node of the PMOS and NMOS of the pair. The PMOS 504 or 514 may be connected to a positive supply gp at a source thereof, and the NMOS 506 or 516 may be connected to a negative supply gn at a source thereof. The supply voltages gp and gn may be coupled to multiple switches (e.g., via any number of discrete drivers) and may therefore be common between the switches of a decoder for a given address line type (WL or BL). Each PMOS and each NMOS may be biased at a gate thereof (hereinafter "lsel", with "lselp" referring to the gate of a PMOS and "lseln" referring to the gate of an NMOS). Turning a PMOS on would supply a positive bias to the corresponding lbwl, and turning an NMOS on would supply a negative bias to the corresponding lbwl. Since an address line lbwl may be biased either positively or negatively, the decoder may be referred to as a bipolar decoder or a bipolar multiplexer.

The decoder portion 500 of FIG. 5 includes switches with four terminal transistors including sources (connected to gp and gn respectively for the PMOS and the NMOS), drains (including a common drain coupled to lbwl), gates (lselp and lseln) and body biases (bb) which, for each PMOS are biased to VPP and for each NMOS are biased to VNN regardless of whether the switch is in an idle state (as shown in FIG. 5), supplying a positive bias to the selected address line (as shown in FIG. 6), or supplying a negative bias to the selected address line (as shown in FIG. 7).

The nodes (gp, lselp, lseln, gn, and, consequently, the address lines lbwl) of a decoder circuitry may be driven to various biases, for example by a memory controller (e.g., 210) on a memory partition, which memory partition controller 210 may, as noted above, be configured to manage operations of WL control logic 214 and BL control logic 216 based, at least in part, on WL and/or BL identifiers included in a received memory operation command. The WL control logic 214 and BL control logic 216 may include, respectively a WL switch circuitry 220 and a BL switch circuitry 224.

Referring still to FIG. 5, in order to select an address line lbwl (hereinafter "lbwls" referring to a selected WL or a selected BL), either the PMOS 504 or the NMOS 506 of the associated switch is turned on to pass, respectively, a positive bias or a negative bias to lbwls. The switching of the lbwls to a positive bias (as shown in FIG. 6) may involve the biasing of the associated NMOS gate lselns to a different value than at its idle state (e.g., from VCC to VSS, where the underlining of VSS applied to lselns in FIG. 6 represents that the voltage VSS applied to lselns has changed relative to the voltage applied to lselns in the idle state), and the switching of the lbwls to a negative bias may involve the biasing of the associated PMOS gate lselps to a different value than at its idle state (e.g., from VEE to VSS as shown in FIG. 7).

The turning on or off of a MOSFET within a memory decoder switch may be caused by changing one or more node biases for the switch starting from an idle bias at the one or more nodes. In addition to selecting an address line for biasing for a memory cell operation as noted above, each of the remaining switches for the unselected address lines lbwl (hereinafter "lbwld") may have a bias of a MOS transistor gate thereof changed with respect to an idle bias of that gate in order to implement deselection of that address line. Thus, referring still to FIG. 5, where lbwls is to be biased to a positive or negative bias for selection, all remaining address lines, that is, all lbwld nodes (only one of which is shown) are to remain biased to VSS (e.g., 0V or reference ground) for deselection as compared with their bias at idle state. In order for all lbwld nodes to remain at VSS with respect to their bias at idle state, the gate of the PMOS for each lbwld (hereinafter "lselpd") or the gate of the NMOS for each lbwld (hereinafter "lselnd") may have its bias changed with respect to idle, depending on whether, respectively, lbwls is to be biased to a positive voltage or a negative voltage. Thus, as shown in FIG. 6, in the positive bias case, the bias applied to PMOS 514 is changed from VEE to VPPs to bias node lbwld to VSS whereas in the negative bias case, the bias applied to NMOS 514 is changed from VCC to VNNs to bias node lbwld to VSS. The biasing of the deselected wordlines and bitlines may be performed to prevent shorts between gp and gn.

Disadvantageously, since there are m address lines for every one selected address line (for an array of m+1 address lines, such as m+1 WLs and/or m+1 BLs), the gate bias change for MOS transistors of deselected address lines would occur m times, in this way significantly increasing the energy expenditure of address line selection.

Figure 8:
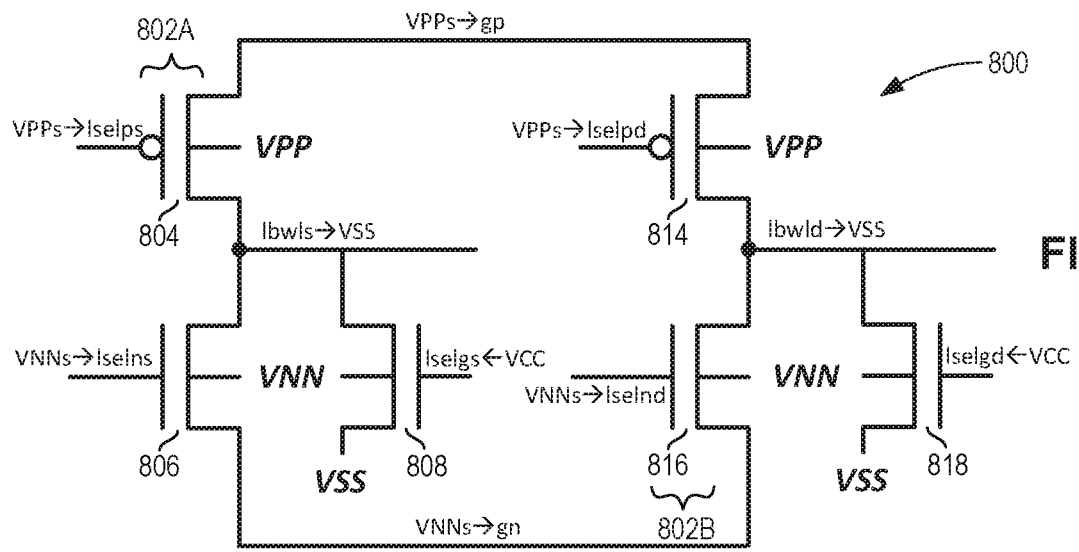
FIG. 8 is a schematic illustration of a portion of an enhanced decoder circuitry for address lines in a 3D crosspoint memory architecture in an idle state in accordance with certain embodiments.

FIG. 8 is a schematic illustration of a portion 800 of an enhanced decoder circuitry for address lines in a 3D crosspoint memory architecture in an idle state in accordance with certain embodiments. This portion 800 may have any suitable characteristics of the decoder portion 500 described above. Portion 800 includes switches 802A (comprising transistor pair 804 and 806) and 802B (comprising transistor pair 814 and 816) which are similar to switches 502A and 502B respectively. In the enhanced decoder circuitry, an additional "deselect bias device" is coupled to the output of each switch. For example, NMOS 808 is coupled to the output (e.g., node lbwls which is coupled to a selected BL or WL) of switch 802A. As another example, NMOS 818 may be coupled to the output (e.g., node lbwld which is coupled to a deselected BL or WL) of switch 802B. As in the above (although not shown), the switch 802B (and coupled NMOS 818) may be replicated for each additional deselected address line. In the embodiment depicted, each deselect bias device has a gate that may be selectively biased (according to the desired state of the decoder), a terminal coupled to lbwl, another terminal coupled to VSS (or other neutral bias voltage), and a body bias of VNN.

Figure 9:
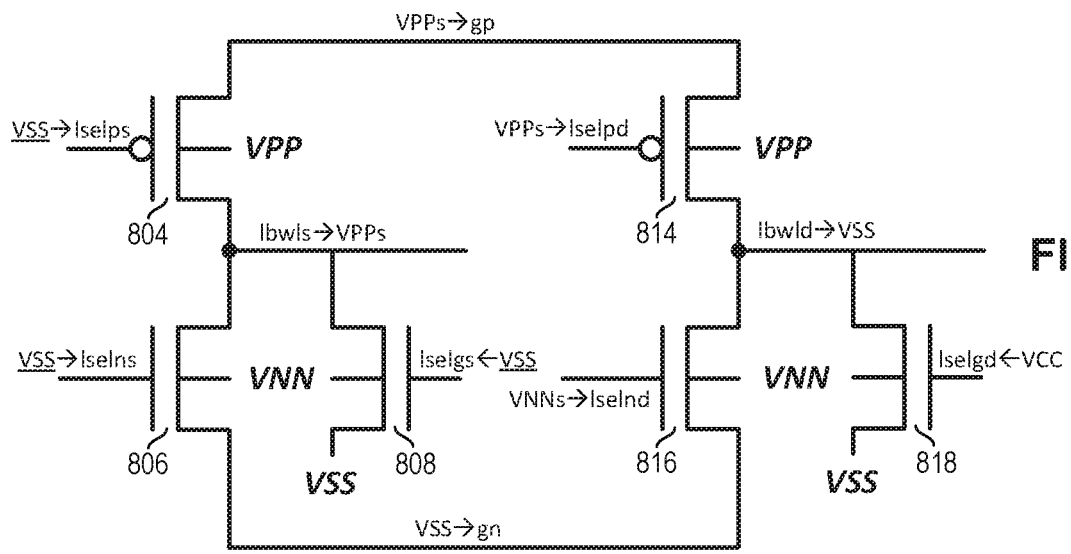
FIG. 9 is a schematic illustration of a portion of the enhanced decoder circuitry of FIG. 8 in a positive bias state in accordance with certain embodiments.
Figure 10:
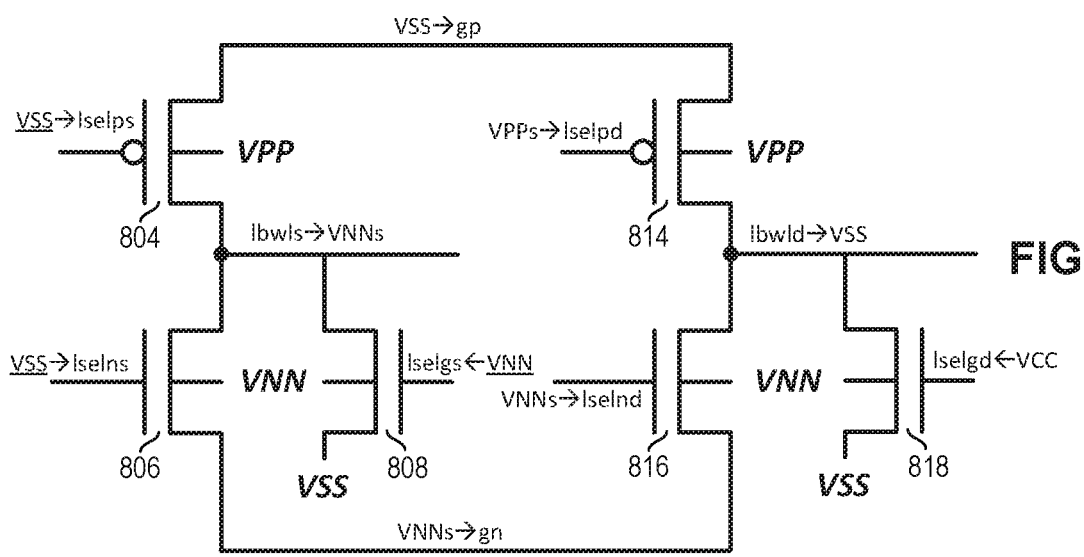
FIG. 10 is a schematic illustration of a portion of the enhanced decoder circuitry of FIG. 8 in a negative bias state in accordance with certain embodiments.

FIG. 9 is a schematic illustration of the portion 800 of the enhanced decoder circuitry of FIG. 8 in a positive bias state (where the lbwls is coupled to a positive bias) and FIG. 10 is a schematic illustration of the portion 800 in a negative bias state (where the lbwls is coupled to a negative bias) in accordance with certain embodiments. The addition of the deselect bias devices allows the transistors of the switches (e.g., 802A, 802B, and other similar switches coupled to the other unselected address lines) to remain in an off state unless configured to supply a select bias voltage to a selected WL or BL. Accordingly, the deselect gates (e.g., lselpd and lselnd) do not need to have their applied voltages toggled in order to prevent shorts between the gn and gp nodes as in the switches illustrated by FIG. 5. Because the biases of the m deselect gates (where m is a generally large number) do not change when the decoder transitions from an idle state to a positive or negative bias state (e.g., during selection of a bitline and a deselection of the other bitlines by one decoder and selection of a wordline and deselection of the other wordlines by another decoder), the energy expended during the transition is significantly reduced. In various embodiments, in addition to drastically reducing the number of transistors that switch states, the voltage swings in the biases for the transistors that do switch states may also be decreased.

Returning to FIG. 8, when a decoder is placed in an idle state, VSS (or some other neutral voltage between a positive bias and a negative bias) may be applied to all of the address lines coupled to the decoder. In the embodiment depicted, this is accomplished by biasing the transistors such that the PMOS devices (e.g., 804 and 814) and NMOS devices (e.g., 806 and 816) are off. In the embodiment depicted, this is accomplished by biasing the gates and the sources of each of these transistors to the same voltage level (e.g., by applying VPPs to nodes gp and lselp for the PMOS and by applying VNNs to nodes gn and lseln for the NMOS). VCC is then applied to the gates of the deselect bias devices (e.g., 808, 818) to couple VSS (or other neutral voltage such as (gp+gn)/2) to the outputs of the switches (e.g., the lbwl nodes). VSS now has its own path to the WL or BL through the deselect bias device (e.g., 808, 816), such that the deselect bias device may supply the neutral bias voltage (e.g., VSS) to the lbwl node in the idle state and when the particular address line is deselected when the decoder is applying a positive or negative voltage to a selected address line. This is different from the circuit illustrated in FIG. 5, where the path for the neutral bias voltage was shared through the NMOS and PMOS devices of the switches such that the bias for the idle state had to come through the same transistor as the bias for a positive or negative state).

As the decoder switches from an idle state to a positive bias state as shown in FIG. 9, the biases on the gates of the switches (e.g., 802B) and corresponding deselect bias devices (e.g., 818) coupled to the deselected address lines do not change, resulting in a significant energy savings. The only gate voltages that change are the gate voltages for the switch (e.g., 802A) and deselect bias device (e.g., 808) coupled to the selected address line to which the positive bias (VPPs) is applied via lbwls. For example, lselps changes from VPPs to VSS, lselns changes from VNNs to VSS, and lselgs changes from VCC to VSS (to turn NMOS 808 off to disconnect VSS from lbwls). The unselected address lines are kept at VSS (via respective lbwld nodes).

Similarly, as the decoder switches from an idle state to a negative bias state as shown in FIG. 10, the biases on the gates of the switches (e.g., 802B) and corresponding deselect bias devices (e.g., 818) coupled to the deselected address lines do not change, again resulting in a significant energy savings. The only gate voltages that change are the gate voltages for the switch (e.g., 802A) and the deselect bias device (e.g., 808) coupled to the selected address line to which the negative bias (VNNs) is applied via lbwls. For example, lselps changes from VPPs to VSS, lselns changes from VNNs to VSS, and lselgs changes from VCC to VNN. The unselected address lines are kept at VSS (via respective lbwld nodes).

FIG. 11 is a table illustrating bias voltages for the decoder portion 500 illustrated in FIG. 5 in accordance with certain embodiments. FIG. 11 shows bias values for each of gp, lselp, lbwl, lseln, and gn for the bipolar decoder of FIG. 5 for each of a positively biased selected lbwl (corresponding to the biases illustrated in FIG. 6), a negatively biased selected lbwl (corresponding to the biases illustrated in FIG. 7) and an idle state for the address lines (corresponding to the biases illustrated in FIG. 5). It is noted that, for a memory operation to take place, the decoder nodes are to be initialized to an idle state before a selection or deselection of the various address lines takes place. The change in bias for each node is therefore based on a change from the corresponding bias value at the idle state, which provides a known neutral value for each address line. A selection of an lbwls for biasing to either a positive bias or a negative bias entails the change of bias values of, respectively, all PMOS gates or all NMOS gates for each remaining deselected address line (lbwld) of the same type (WL or BL) as the selected lbwls, as indicated for deselected line biases underlined in FIG. 11. Thus, during a transition from the idle state, m deselected gates are toggled to block shorts between gn/gp and to bias the deselected address lines to VSS, resulting in a large energy expenditure.

FIG. 12 is a table illustrating bias voltages of the enhanced decoder illustrated in FIG. 8 in accordance with certain embodiments. FIG. 12 shows bias values for each of gp, lselp, lbwl, lseln, gn, and lselg for the bipolar decoder of FIG. 8 for each of a positively biased selected lbwl (corresponding to the biases illustrated in FIG. 9), a negatively biased selected lbwl (corresponding to the biases illustrated in FIG. 10) and an idle state for the address lines (corresponding to the biases illustrated in FIG. 8). A selection of an lbwls for biasing to either a positive bias or a negative bias entails the change of bias values of the PMOS gate (lselp) and NMOS gate (lseln) for the switch coupled to the selected address line (lbwls) as well as the NMOS gate (lselg) of the select bias device for the selected address line, but the biases for the gates associated with the bias circuits (each including a switch and a deselect bias device) coupled to the deselected address lines remain unchanged. Thus, during a transition from the idle state, only three selected gates are toggled in order to provide the proper bias to the lbwls.

Figure 13:
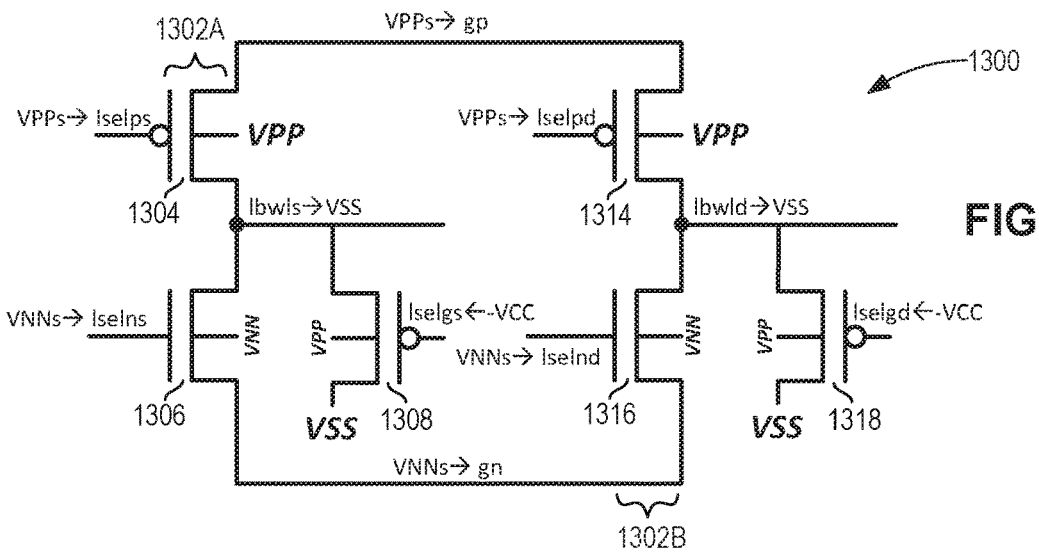
FIG. 13 is a schematic illustration of a portion of another enhanced decoder circuitry for address lines in a 3D crosspoint memory architecture in an idle state in accordance with certain embodiments.

FIG. 13 is a schematic illustration of a portion 1300 of another enhanced decoder circuitry for address lines in a 3D crosspoint memory architecture in an idle state in accordance with certain embodiments. This portion 1300 may have any suitable characteristics of the portion 500 or portion 800 described above. Portion 1300 includes switches 1302A (comprising transistor pair 1304 and 1306) and 1302B (comprising transistor pair 1314 and 1316). In this enhanced decoder circuitry, an additional deselect bias device is coupled to the output of each switch. For example, PMOS 1308 is coupled to the output (e.g., node lbwls which is coupled to a selected BL or WL) of switch 1302A. As another example, PMOS 1318 may be coupled to the output (e.g., node lbwld which is coupled to a deselected BL or WL) of switch 1302B. As in the above (although not shown), the switch 1302B (and coupled PMOS 1318) may be replicated for any number of deselected address lines. In the embodiment depicted, each deselect bias device has a gate that may be biased according to the state of the decoder, a terminal coupled to lbwl, another terminal coupled to VSS (or other neutral voltage), and a body bias of VPP.

Figure 14:
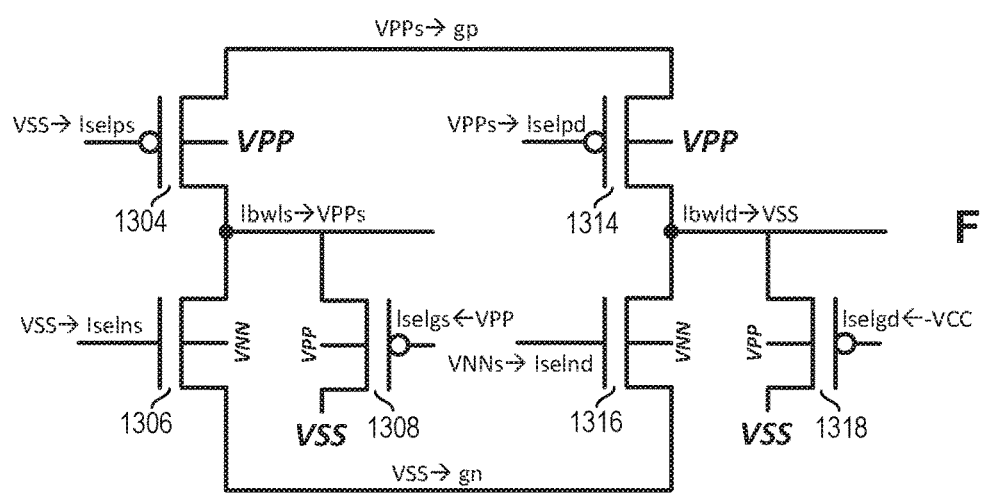
FIG. 14 is a schematic illustration of a portion of the enhanced decoder circuitry of FIG. 13 in a positive bias state in accordance with certain embodiments.
Figure 15:
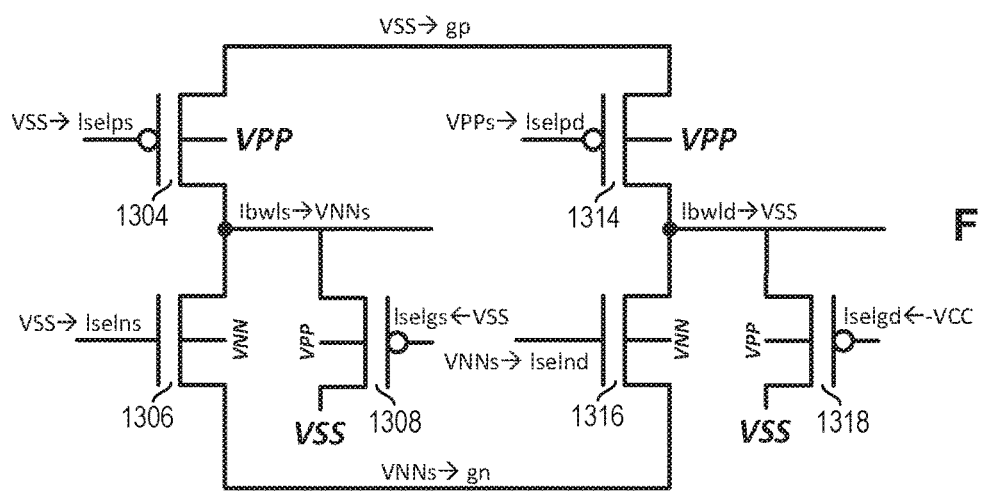
FIG. 15 is a schematic illustration of a portion of the enhanced decoder circuitry of FIG. 13 in a negative bias state in accordance with certain embodiments.

FIG. 14 is a schematic illustration of the portion 1300 of the enhanced decoder circuitry of FIG. 13 in a positive bias state and FIG. 15 is a schematic illustration of the portion 1300 in a negative bias state in accordance with certain embodiments. The addition of the deselect bias devices 1308 and 1318 allow the devices of the switches (e.g., 1302A, 1302B, and other similar switches coupled to the other address lines) to remain in an off state, unless configured to supply a select bias voltage to a selected WL or BL. Accordingly, the deselect gates (e.g., lselpd and lselnd) do not need to have their applied voltages toggled in order to prevent shorts between the gn and gp nodes as in the switches illustrated by FIG. 5. Because the biases of the m deselect gates do not change when the decoder transitions from an idle state to a positive or negative bias state (e.g., to select a bitline and wordline and to deselect the other bitlines and wordlines), the energy expended during the transition is significantly reduced.

Returning to FIG. 13, when a decoder is placed in an idle state, VSS (or some other neutral voltage) may be applied to all of the address lines coupled to the decoder. In the embodiment depicted, this is accomplished by biasing the transistors such that the PMOS (1304 and 1314) and NMOS (e.g., 1306 and 1316) are both off. In the embodiment depicted, this is accomplished by biasing the gates and the sources of each of these transistors to the same voltage level (e.g., by applying VPPs to nodes gp and lselp for the PMOS devices and by applying VNNs to nodes gn and lseln for the NMOS devices). Negative VCC is then applied to the gates of the deselect bias devices (e.g., 1308, 1318) to couple VSS (or other neutral voltage such as (gp+gn)/2) to the outputs of the switches (e.g., the lbwl nodes).

As the decoder switches from an idle state to a positive bias state as shown in FIG. 14, the biases on the gates of the switches (e.g., 1302B) and corresponding deselect bias devices (e.g., 1318) coupled to the deselected address lines do not change, resulting in a significant energy savings. The only gate voltages that change are the gate voltages for the switch 1302A and deselect bias device (e.g., 1308) coupled to the selected address line to which the positive bias (VPPs) is applied via lbwls. For example, lselps changes from VPPs to VSS, lselns changes from VNNs to VSS, and lselgs changes from negative VCC to VPP (to turn PMOS 1308 off to disconnect VSS from lbwls). The unselected address lines are kept at VSS (via respective lbwld nodes).

Similarly, as the decoder switches from an idle state to a negative bias state as shown in FIG. 15, the biases on the gates of the switches (e.g., 1302B) and corresponding deselect bias devices (e.g., 1318) coupled to the deselected address lines do not change, again resulting in a significant energy savings. The only gate voltages that change are the gate voltages for the switch (e.g., 1302A) and the deselect bias device (e.g., 808) coupled to the selected address line to which the negative bias (VNNs) is applied via lbwls. For example, lselps changes from VPPs to VSS, lselns changes from VNNs to VSS, and lselgs changes from −VCC to VSS. The unselected address lines are kept at VSS (via respective lbwld nodes).

Figure 16:
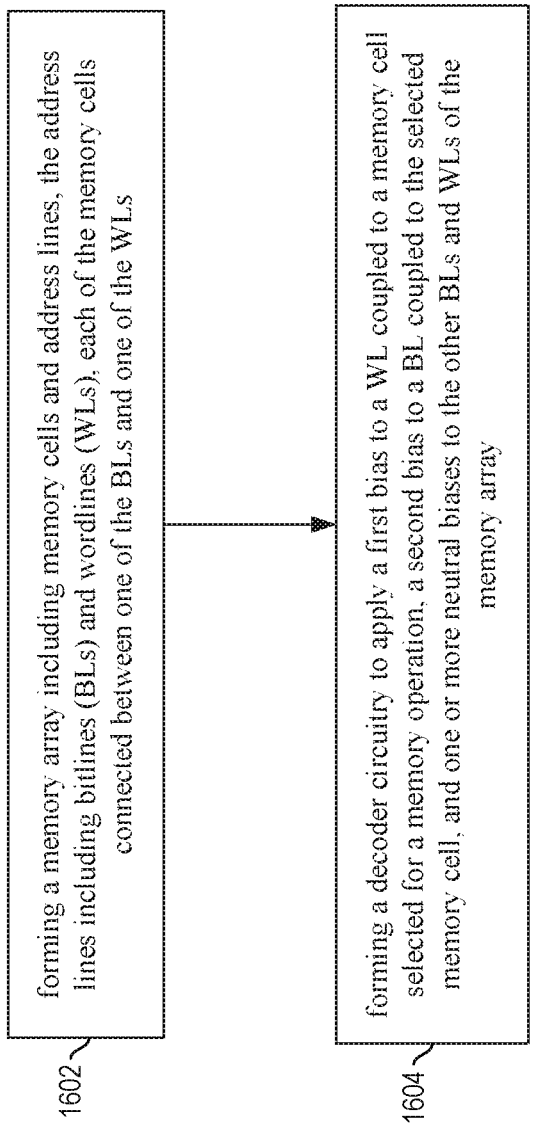
FIG. 16 illustrates an example process for forming a memory array and decoder circuitry in accordance with certain embodiments.

FIG. 16 illustrates an example process for forming a memory and decoder circuitry in accordance with certain embodiments. The process includes, at operation 1602, forming a memory array including memory cells and address lines, the address lines including bitlines (BLs) and wordlines (WLs), each of the memory cells connected between one of the BLs and one of the WLs; and at operation 1604, forming a decoder circuitry to apply a first bias to a WL coupled to a memory cell selected for a memory operation, a second bias to a BL coupled to the selected memory cell, and one or more neutral biases to the other BLs and WLs of the memory array.

The flow described in FIG. 16 is merely representative of operations that may occur in particular embodiments. Some of the operations illustrated in FIG. 16 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory partition controller 210, word line control logic 214, bit line control logic 216, WL switch circuitry 220, BL switch circuitry 224, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g. reset, while an updated value potentially includes a low logical value, e.g. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (e.g., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a memory array including memory cells and address lines, the address lines including bitlines (BLs) and wordlines (WLs), each of the memory cells connected between one of the BLs and one of the WLs; and decoder circuitry to apply a first bias to a WL coupled to a memory cell selected for a memory operation, a second bias to a BL coupled to the selected memory cell, and one or more neutral biases to the other BLs and WLs of the memory array; wherein the decoder circuitry comprises a plurality of bias circuits coupled to the address lines, a first bias circuit of the plurality of bias circuits comprising a transistor pair and an additional transistor coupled to an address line of the address lines, wherein the bias circuit is to apply, to the address line, the first bias through the transistor pair in a first state, the second bias through the transistor pair in a second state, and the neutral bias through the additional transistor in a third state.

Example 2 includes the subject matter of Example 1, wherein the first bias circuit is to apply the first bias to the WL coupled to the selected memory cell, a second bias circuit is to apply the second bias to the BL coupled to the selected memory cell, and additional bias circuits are to apply the one or more neutral biases to the other BLs and WLs of the memory array, wherein gate voltages of the additional bias circuits remain constant responsive to the selection of the memory cell.

Example 3 includes the subject matter of any of Examples 1-2, wherein an output of the transistor pair is directly connected to a first terminal of the additional transistor, and wherein a second terminal of the additional transistor is coupled to a neutral bias of the one or more neutral biases.

Example 4 includes the subject matter of any of Examples 1-3, wherein the additional transistor is an n-type MOS transistor coupled to an output of the transistor pair.

Example 5 includes the subject matter of any of Examples 1-3, wherein the additional transistor is a p-type MOS transistor coupled to an output of the transistor pair.

Example 6 includes the subject matter of Examples 1-5, wherein the first bias has a first polarity and the second bias has a second polarity opposite to the polarity of the first polarity.

Example 7 includes the subject matter of any of Examples 1-6, wherein the first bias is higher than a supply voltage applied to a gate of the additional transistor in the third state to apply a neutral bias to the address line.

Example 8 includes the subject matter of any of Examples 1-7, wherein the first bias is greater than zero volts and the second bias is less than zero volts.

Example 9 includes the subject matter of any of Examples 1-7, wherein the first bias is greater than zero volts and the second bias is greater than or equal to zero volts.

Example 10 includes the subject matter of any of Examples 1-8, wherein a neutral bias is applied to gates of the transistor pair in the third state to turn off the transistor pair.

Example 11 includes the subject matter of any of Examples 1-10, further comprising a central processing unit communicatively coupled to the memory device.

Example 12 includes a method comprising forming a memory array including memory cells and address lines, the address lines including bitlines (BLs) and wordlines (WLs), each of the memory cells connected between one of the BLs and one of the WLs; and forming a decoder circuitry to apply a first bias to a WL coupled to a memory cell selected for a memory operation, a second bias to a BL coupled to the selected memory cell, and one or more neutral biases to the other BLs and WLs of the memory array; wherein the decoder circuitry comprises a plurality of bias circuits coupled to the address lines, a first bias circuit of the plurality of bias circuits comprising a transistor pair and an additional transistor coupled to an address line of the address lines, wherein the bias circuit is to apply, to the address line, the first bias through the transistor pair in a first state, the second bias through the transistor pair in a second state, and the neutral bias through the additional transistor in a third state.

Example 13 includes the subject matter of Example 12, wherein the first bias circuit is to apply the first bias to the WL coupled to the selected memory cell, a second bias circuit is to apply the second bias to the BL coupled to the selected memory cell, and additional bias circuits are to apply the one or more neutral biases to the other BLs and WLs of the memory array, wherein gate voltages of the additional bias circuits remain constant responsive to the selection of the memory cell.

Example 14 includes the subject matter of any of Examples 12-13, wherein an output of the transistor pair is directly connected to a first terminal of the additional transistor, and wherein a second terminal of the additional transistor is coupled to a neutral bias of the one or more neutral biases.

Example 15 includes the subject matter of any of Examples 12-14, wherein the additional transistor is an n-type MOS transistor coupled to an output of the transistor pair.

Example 16 includes the subject matter of any of Examples 12-14, wherein the additional transistor is a p-type MOS transistor coupled to an output of the transistor pair.

Example 17 includes the subject matter of Examples 12-16, wherein the first bias has a first polarity and the second bias has a second polarity opposite to the polarity of the first polarity.

Example 18 includes the subject matter of any of Examples 12-17, wherein the first bias is higher than a supply voltage applied to a gate of the additional transistor in the third state to apply the neutral voltage to the address line.

Example 19 includes the subject matter of any of Examples 12-18, wherein the first bias is greater than zero volts and the second bias is less than zero volts.

Example 20 includes the subject matter of any of Examples 12-18, wherein the first bias is greater than zero volts and the second bias is greater than or equal to zero volts.

Example 21 includes the subject matter of any of Examples 12-20, wherein the neutral voltage is applied to gates of the transistor pair in the third state to turn off the transistor pair.

Example 22 includes the subject matter of any of Examples 12-21, further comprising coupling a central processing unit to the memory device.

Example 23 includes at least one non-transitory machine readable storage medium having instructions stored thereon, the instructions when executed by a machine to cause the machine to select a target memory cell of a memory array comprising a plurality of memory cells and address lines, the address lines including bitlines (BLs) and wordlines (WLs), each of the memory cells connected between one of the BLs and one of the WLs, wherein selection of the target memory cell comprises applying a first bias to a BL coupled to the selected memory cell through a first transistor pair of a first bias circuit and applying a second bias to a WL coupled to the selected memory cell through a second transistor pair of a second bias circuit; and deselect the other memory cells of the memory array by applying one or more neutral biases to the other BLs and WLs through a plurality of additional bias circuits, each additional bias circuit comprising an additional transistor coupled to a transistor pair, wherein the one or more neutral biases are applied through the additional transistors of the additional bias circuits.

Example 24 includes the subject matter of Example 23, wherein selecting the target memory cell comprises changing gate voltages of the first transistor pair and second transistor pair and deselecting the other memory cells comprises holding gate voltages of the additional bias circuits constant.

Example 25 includes the subject matter of any of Examples 23-24, wherein the first bias is higher than a supply voltage applied to a gate of the transistor of an additional bias circuit to cause the additional transistor to apply a neutral bias to one of the other BLs or WLs.

Example 26 includes the subject matter of any of Examples 23-25, wherein selecting the target memory cell further comprises applying a neutral bias to an n-type MOS transistor coupled to the first transistor pair.

Example 27 includes the subject matter of any of Examples 23-25, wherein selecting the target memory cell further comprises applying a negative bias to a p-type MOS transistor coupled to the first transistor pair.

Example 28 includes a system comprising: means to select a target memory cell of a memory array comprising a plurality of memory cells and address lines, the address lines including bitlines (BLs) and wordlines (WLs), each of the memory cells connected between one of the BLs and one of the WLs, wherein selection of the target memory cell comprises applying a first bias to a BL coupled to the selected memory cell through a first transistor pair of a first bias circuit and applying a second bias to a WL coupled to the selected memory cell through a second transistor pair of a second bias circuit; and means to deselect the other memory cells of the memory array by applying one or more neutral biases to the other BLs and WLs through a plurality of additional bias circuits, each additional bias circuit comprising an additional transistor coupled to a transistor pair, wherein the one or more neutral biases are applied through the additional transistors of the additional bias circuits.

Example 29 includes the subject matter of Example 28, wherein selecting the target memory cell comprises changing gate voltages of the first transistor pair and second transistor pair and deselecting the other memory cells comprises holding gate voltages of the additional bias circuits constant.

Example 30 includes the subject matter of any of Examples 28-29, wherein the first bias is higher than a supply voltage applied to a gate of the transistor of an additional bias circuit to cause the additional transistor to apply a neutral bias to one of the other BLs or WLs.

Example 31 includes the subject matter of any of Examples 28-30, wherein selecting the target memory cell further comprises applying a neutral bias to an n-type MOS transistor coupled to the first transistor pair.

Example 32 includes the subject matter of any of Examples 28-30, wherein selecting the target memory cell further comprises applying a negative bias to a p-type MOS transistor coupled to the first transistor pair.

Example 33 includes a device comprising: one or more processors and one or more computer-readable media comprising instructions that, when executed by the one or more processors, cause the one or more processors to perform the method, techniques, or process as described in or related to any of the Examples above, or portions thereof.

Example 34 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 35 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A memory device including:
a memory array including memory cells and address lines, the address lines including bitlines (BLs) and wordlines (WLs), each of the memory cells connected between one of the BLs and one of the WLs; and
decoder circuitry to apply a first bias to a WL coupled to a memory cell selected for a memory operation, a second bias to a BL coupled to the selected memory cell, and one or more neutral biases to the other BLs and WLs of the memory array;
wherein the decoder circuitry comprises a plurality of bias circuits coupled to the address lines, a first bias circuit of the plurality of bias circuits comprising a transistor pair and an additional transistor coupled to an address line of the address lines, wherein the bias circuit is to apply, to the address line, the first bias through the transistor pair in a first state, the second bias through the transistor pair in a second state, and the neutral bias through the additional transistor in a third state.

2. The memory device of claim 1, wherein the first bias circuit is to apply the first bias to the WL coupled to the selected memory cell, a second bias circuit is to apply the second bias to the BL coupled to the selected memory cell, and additional bias circuits are to apply the one or more neutral biases to the other BLs and WLs of the memory array, wherein gate voltages of the additional bias circuits remain constant responsive to the selection of the memory cell.

3. The memory device of claim 1, wherein an output of the transistor pair is directly connected to a first terminal of the additional transistor, and wherein a second terminal of the additional transistor is coupled to a neutral bias of the one or more neutral biases.

4. The memory device of claim 1, wherein the additional transistor is an n-type MOS transistor coupled to an output of the transistor pair.

5. The memory device of claim 1, wherein the additional transistor is a p-type MOS transistor coupled to an output of the transistor pair.

6. The memory device of claim 1, wherein the first bias has a first polarity and the second bias has a second polarity opposite to the polarity of the first polarity.

7. The memory device of claim 1, wherein the first bias is higher than a supply voltage applied to a gate of the additional transistor in the third state to apply a neutral bias to the address line.

8. The memory device of claim 1, wherein the first bias is greater than zero volts and the second bias is less than zero volts.

9. The memory device of claim 1, wherein the first bias is greater than zero volts and the second bias is greater than or equal to zero volts.

10. The memory device of claim 1, wherein a neutral bias is applied to gates of the transistor pair in the third state to turn off the transistor pair.

11. The memory device of claim 1, further comprising a plurality of memory chips, wherein a first memory chip comprises the memory array and decoder circuitry.

12. The memory device of claim 11, further comprising a memory controller to communicate with the plurality of memory chips.

13. The memory device of claim 12, further comprising a central processing unit communicatively coupled to the memory device.

14. The memory device of claim 1, wherein the memory device comprises a solid state drive or a dual in-line memory module.

15. A method comprising:
forming a memory array including memory cells and address lines, the address lines including bitlines (BLs) and wordlines (WLs), each of the memory cells connected between one of the BLs and one of the WLs; and
forming a decoder circuitry to apply a first bias to a WL coupled to a memory cell selected for a memory operation, a second bias to a BL coupled to the selected memory cell, and one or more neutral biases to the other BLs and WLs of the memory array; wherein the decoder circuitry comprises a plurality of bias circuits coupled to the address lines, a first bias circuit of the plurality of bias circuits comprising a transistor pair and an additional transistor coupled to an address line of the address lines, wherein the bias circuit is to apply, to the address line, the first bias through the transistor pair in a first state, the second bias through the transistor pair in a second state, and the neutral bias through the additional transistor in a third state.

16. The method of claim 15, wherein an output of the transistor pair is directly connected to a first terminal of the additional transistor, and wherein a second terminal of the additional transistor is coupled to a neutral bias of the one or more neutral biases.

17. At least one non-transitory machine readable storage medium having instructions stored thereon, the instructions when executed by a machine to cause the machine to:
select a target memory cell of a memory array comprising a plurality of memory cells and address lines, the address lines including bitlines (BLs) and wordlines (WLs), each of the memory cells connected between one of the BLs and one of the WLs, wherein selection of the target memory cell comprises applying a first bias to a BL coupled to the selected memory cell through a first transistor pair of a first bias circuit and applying a second bias to a WL coupled to the selected memory cell through a second transistor pair of a second bias circuit; and
deselect the other memory cells of the memory array by applying one or more neutral biases to the other BLs and WLs through a plurality of additional bias circuits, each additional bias circuit comprising an additional transistor coupled to a transistor pair, wherein the one or more neutral biases are applied through the additional transistors of the additional bias circuits.

18. The machine readable storage medium of claim 17, wherein selecting the target memory cell comprises changing gate voltages of the first transistor pair and second transistor pair and deselecting the other memory cells comprises holding gate voltages of the additional bias circuits constant.

19. The machine readable storage medium of claim 17, wherein the first bias is higher than a supply voltage applied to a gate of the additional transistor of an additional bias circuit to cause the additional transistor to apply a neutral bias to one of the other BLs or WLs.

20. The machine readable storage medium of claim 17, wherein selecting the target memory cell further comprises applying a neutral bias to an n-type MOS transistor coupled to the first transistor pair.

* * * * *